(12) United States Patent
Stoltz et al.

(10) Patent No.: US 11,456,577 B2
(45) Date of Patent: Sep. 27, 2022

(54) MONOLITHIC QUANTUM CASCADE LASER (QCL)/AVALANCHE PHOTODIODE (APD) INFRARED TRANSCEIVER

(71) Applicant: Raytheon Company, Waltham, MA (US)

(72) Inventors: Steven M. Stoltz, Tucson, AZ (US); Terrell D. Neal, Sahuarita, AZ (US)

(73) Assignee: Raytheon Company, Waltham, MA (US)

( * ) Notice: Subject to any disclaimer, the term of this patent is extended or adjusted under 35 U.S.C. 154(b) by 170 days.

(21) Appl. No.: 16/941,254

(22) Filed: Jul. 28, 2020

(65) Prior Publication Data
US 2022/0037858 A1     Feb. 3, 2022

(51) Int. Cl.
*H01S 5/34*      (2006.01)
*H01S 5/026*      (2006.01)
(Continued)

(52) U.S. Cl.
CPC .......... *H01S 5/3402* (2013.01); *H01S 5/0264* (2013.01); *H01S 5/0614* (2013.01);
(Continued)

(58) Field of Classification Search
CPC .............. H01S 5/125; H01S 5/0262–0264
See application file for complete search history.

(56) References Cited

U.S. PATENT DOCUMENTS

| | | | | |
|---|---|---|---|---|
| 4,470,143 A | * | 9/1984 | Kitamura | ........ H01S 5/20 |
| | | | | 372/50.23 |
| 4,947,400 A | * | 8/1990 | Dutta | ........ H01S 5/0264 |
| | | | | 372/50.21 |

(Continued)

FOREIGN PATENT DOCUMENTS

| CN | 104051561 A | * | 9/2014 | ...... H01L 31/03048 |
|---|---|---|---|---|
| CN | 108963750 A | * | 12/2018 | ......... H01S 5/0262 |

(Continued)

OTHER PUBLICATIONS

Afek, I., et al., "An Easy Road to High Noon", CLEO:2011—Laser Applications to Photonic Applications, OSA Technical Digest (CD) (Optical Society of America, 2011), 2 pgs.

(Continued)

*Primary Examiner* — Joshua King
(74) *Attorney, Agent, or Firm* — Schwegman Lundberg & Woessner, P.A.

(57) ABSTRACT

A monolithic QCL/APD IR Transceiver in which the QCL transmitter and APD receiver have the same N MQW stage composition and variation in thickness in the z direction for all positions in x and y directions. The heterostructure is configured via asymmetric stages, additional stages for the APD or by reversing the polarity of the p-n junction for the APD or a combination thereof such that the upper energy state in the QCL under forward bias is confined to the quantum well and in the APD under reverse bias is near the top of the quantum well in energy and localized in the quantum well to spatially overlap with the lower energy state to facilitate detection of echo photons. The QCL and APD may be positioned end-to-end, side-by-side or as a common region of the heterostructure.

22 Claims, 8 Drawing Sheets

(51) Int. Cl.
*H01S 5/06* (2006.01)
*H01S 5/125* (2006.01)
*H01S 5/028* (2006.01)

(52) U.S. Cl.
CPC ............ *H01S 5/125* (2013.01); *H01S 5/0287* (2013.01); *H01S 5/0615* (2013.01)

(56) References Cited

U.S. PATENT DOCUMENTS

| | | | |
|---|---|---|---|
| 5,121,181 A * | 6/1992 | Smith, III | B82Y 20/00 257/432 |
| 5,446,751 A * | 8/1995 | Wake | H01S 5/50 372/50.1 |
| 5,457,709 A | 10/1995 | Capasso et al. | |
| 5,608,233 A * | 3/1997 | Sahara | H01S 5/18 |
| 5,679,947 A * | 10/1997 | Doi | G11B 7/133 |
| 5,936,989 A | 8/1999 | Capasso et al. | |
| 5,956,362 A * | 9/1999 | Yokogawa | H01S 5/18341 372/96 |
| 5,978,401 A * | 11/1999 | Morgan | H01S 5/0262 398/115 |
| 6,229,152 B1 * | 5/2001 | Dries | B82Y 20/00 257/17 |
| 6,404,791 B1 * | 6/2002 | Yang | H01S 5/34 372/45.01 |
| 6,580,739 B1 * | 6/2003 | Coldren | B82Y 20/00 372/50.1 |
| 6,614,086 B2 * | 9/2003 | Kim | B82Y 20/00 257/187 |
| 8,098,969 B2 * | 1/2012 | Tolstikhin | H01S 5/5018 385/14 |
| 8,611,756 B1 * | 12/2013 | Wach | G02B 6/43 398/140 |
| 9,240,674 B2 | 1/2016 | Edamura et al. | |
| 9,991,677 B2 * | 6/2018 | Briggs | H01S 5/22 |
| 2004/0028105 A1 * | 2/2004 | Peters | B82Y 20/00 372/50.1 |
| 2005/0147145 A1 * | 7/2005 | Behfar | H01S 5/0625 372/64 |
| 2007/0110357 A1 * | 5/2007 | Forrest | H01L 31/02327 385/28 |
| 2007/0152225 A1 * | 7/2007 | Ooi | H01L 33/0045 257/E33.054 |
| 2010/0029026 A1 * | 2/2010 | Berger | H01L 31/035236 438/24 |
| 2010/0177297 A1 | 7/2010 | Guha et al. | |
| 2011/0135314 A1 * | 6/2011 | Tolstikhin | H01S 5/0262 398/149 |
| 2011/0158653 A1 * | 6/2011 | Mazed | H04B 10/5161 398/140 |
| 2012/0051378 A1 * | 3/2012 | Kar | H01S 5/183 257/77 |
| 2012/0207186 A1 | 8/2012 | Belkin et al. | |
| 2013/0087692 A1 | 4/2013 | Woodward et al. | |
| 2013/0250301 A1 * | 9/2013 | Feitisch | G01N 21/274 356/409 |
| 2013/0322480 A1 | 12/2013 | Edamura et al. | |
| 2015/0263488 A1 * | 9/2015 | Caneau | H01S 5/4068 438/22 |
| 2015/0333482 A1 * | 11/2015 | Briggs | H01S 5/1237 372/45.01 |
| 2016/0049770 A1 * | 2/2016 | Frez | H01S 5/2205 372/45.01 |
| 2016/0352072 A1 * | 12/2016 | Belkin | G02F 1/3534 |
| 2017/0059474 A1 * | 3/2017 | Cohen | G02B 7/008 |
| 2017/0115213 A1 * | 4/2017 | Ito | H01S 5/0264 |
| 2017/0179682 A1 * | 6/2017 | Ishii | A61B 5/0261 |
| 2019/0011361 A1 * | 1/2019 | Dougakiuchi | H01L 31/035236 |
| 2019/0326466 A1 * | 10/2019 | Hitaka | H01L 31/03046 |

FOREIGN PATENT DOCUMENTS

| | | | | |
|---|---|---|---|---|
| EP | 2924481 A1 | * | 9/2015 | ......... G02B 6/12004 |
| GB | 2475099 A | * | 5/2011 | ............ B82Y 10/00 |
| KR | 20020093269 A | * | 12/2002 | |
| WO | WO-9625780 A1 | * | 8/1996 | ............ H01S 5/141 |
| WO | WO-2009074951 A2 | * | 6/2009 | ........... G06F 3/0317 |
| WO | WO-2018213734 A1 | * | 11/2018 | ............. H01S 5/021 |

OTHER PUBLICATIONS

Aristin, P., et al., "New doped multiple-quantum-well avalanche photodiode: The doped barrier Al0.35Ga0.65As/GaAs multiple-quantum-well avalanche photodiode", Applied Physics Letters 60, (Jan. 6, 1992), 85-87.

Hayat, Alex, et al., "Observation of two-photon emission from semiconductors", Nature Photonics, vol. 2, (Apr. 2008), 238-241.

Pakmanesh, Nahid, et al., "Quantum cascade laser-based sensors for the detection of exhaled carbon monoxide", Applied Physics B 122:10, (Jan. 20, 2016), 9 pgs.

Pryde, G.J., et al., "Creation of maximally entangled photon-number states using optical fiber multiports", Phys. Rev. A 68, 052315, (Nov. 21, 2003), 5 pgs.

Resch, K.J., "Time-reversal and super-resolving phase measurements", Phys. Rev. Lett. 98, 223601, (May 31, 2007), 4 pgs.

Xu, P., et al., "Review Article: Quasi-phase-matching engineering of entangled photons", AIP Advances 2, 041401 (2012), (Dec. 28, 2012), 11 pgs.

* cited by examiner

MONOLITHIC QUANTUM CASCADE LASER (QCL)/AVALANCHE PHOTODIODE (APD) INFRARED TRANSCEIVER

BACKGROUND OF THE INVENTION

Field of the Invention

This invention relates to Quantum Cascade Lasers (QCLs) and Avalanche Photodiodes (APDS), and more particularly to their monolithic integration as an Infrared (IR) Transceiver (Tx/Rx).

Description of the Related Art

Radar emits RF or MMW signals at longer wavelengths capable of penetrating the atmosphere through cloud cover. Complex waveforms can be imposed on the electrical signals used to drive the antenna(s). The radar both transmits and receives the return signal. Lidar uses lasers such as a QCL, interband (conduction to valence band) semiconductor heterostructure laser or diode pumped Nd:YAG to generate optical signals at shorter wavelengths (e.g. IR band) that can image a target at higher resolution than radar. Complex waveforms are more challenging in lidar. A separate optical detector such as an APD is used to receive and process the return signal. The principle drawback is that the shorter wavelengths traditionally available to lidar cannot penetrate as far into the atmosphere or through clouds. Imaging systems have employed a combination of radar, lidar and electro-optic (EO) digital charge coupled device (CCD) array cameras to gain the most information about a target.

QCLs are semiconductor lasers that emit in the mid- to far-infrared portion of the electromagnetic spectrum e.g., 3-15 microns. Unlike typical interband semiconductor lasers that emit electromagnetic radiation through the recombination of electron-hole pairs across the material band gap, QCLs are unipolar and laser emission is achieved through the use of intersubband transitions in a repeated stack of semiconductor multiple quantum well (MQW) heterostructures above or below an n-type region. The QCL was described by Capasso in U.S. Pat. No. 5,457,709 entitled "Unipolar Semiconductor Laser" issued Oct. 10, 1995 and U.S. Pat. No. 5,936,989 "Quantum Cascade Laser" issued Aug. 10, 1999. U.S. Patent Publication 2010/0177297A1 entitled "Systems and Methods for Quantum Receivers for Target Detection Using a Quantum Optical Radar" disclosed an optical target detection system in FIG. 1A that includes a quantum-illumination transmitter 106 and a quantum-illumination receiver 118.

Each MQW stage consists of a periodic series of thin layers (well and barrier layers) of varying material composition, which introduces a varying electric potential across the length of the device and leads to the splitting of the band of permitted energies into a number of discrete electronic subbands. By suitable design of the layer thicknesses it is possible to engineer a population inversion between two subbands in the system, which is required to achieve laser emission. Because the position of the energy levels in the system is primarily determined by the layer thicknesses and not the material, it is possible to tune the emission wavelength of QCLs over a wide range in the same material system. In a typical three-level system, the energy position of three confined subbands in a quantum well can be engineered with quantum well layer thickness, making it possible, limited by the material constraint of the band offset in the heterojunction, to design a desired band of output emission wavelengths of the QCL, which can be further tuned by the feedback of laser cavity mirrors. Once an electron has undergone an intersubband transition and emitted a photon, it can tunnel into the next MQW where another photon can be emitted, hence the term cascade. This makes a quantum efficiency of greater than unity possible and leads to higher output powers.

QCLs are typically based on a three-level system in which electrons are injected via the n type contact at energy level E3 and decay to E2 to provide the laser transition. E2-E1 is tuned to the desired photon energy. Electrons move from E2 to E1 to deplete E2 so that electrons in E3 can continue to transition and lase. In forward bias, E1 is close to E3 in the next stage to tunnel through the barrier. The scattering rates are tailored by suitable design of the layer thicknesses in the superlattice (e.g. MQW), which determine the electron wave functions of the subbands. The scattering rate between two subbands is heavily dependent upon the overlap of the wave functions and energy spacing between the subbands.

A laser cavity is formed around the heterostructure to form the QCL. The laser emission from E3-E2 is relatively broadband. The laser cavity provides feedback at a particular wavelength within that band to emit at that wavelength. A Fabry-Perot cavity includes the heterostructure as the gain medium. The ends of the heterostructure are cleaved to form two parallel mirrors that define the cavity. The output mirror is partially transmissive to generate the laser output. The laser may be Q-switched by replacing at least the output mirror with an electronically-switched mirror. When in a low Q state, the heterostructure is pumped until the stored energy reaches a maximum. The mirror is then switched to a high Q state allowing feedback and laser emission in a short pulse with very high intensity.

Avalanche photodiodes (APDs) are highly sensitive photodiodes (p-n junctions) that exploit the photoelectric effect to convert light into electricity. The APD creates an amplified current for any electron that is injected into the conduction band. Electrons can be injected into the avalanche multiplication region of the APD by photo absorption from the valence band to conduction band gap. From a functional standpoint, APDs can be regarded as the semiconductor analog of photomultipliers. By applying a high reverse bias voltage, APDs show an internal current gain effect due to an avalanche effect. If very high gain is needed, single-photon avalanche diodes (SAPDs) can be operated with a reverse bias voltage above a typical APD's breakdown voltage. SPADs operating in a high-gain regime are sometimes referred to as being in Geiger mode, which is useful for single-photon detection. U.S. Pat. No. 6,614,086 entitled "Avalanche Photodetector" comprises multiple avalanche-gain layered structures using intersubband transition of electrons. P. Aristin et. al., "New doped multiple quantum-well avalanche photodiode: The doped barrier Al0.35Ga0.65 As/GaAs multiple quantum well avalanche photodiode" Appl. Phys. Lett. 60 (1), January 1992 reported a multiple-quantum-well avalanche photodiode (MQW APD) to increase the $\alpha/\beta$ factor to reduce noise.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides for a monolithic infrared transceiver (Tx/Rx) in which a QCL and APD are formed from first and second regions of an intrinsic (i) semiconductor heterostructure including N Multiple Quantum Well (MQW) stages. The first and second regions include the same N MQW stage composition and variation in thickness in the z direction for all positions in the x and y directions. The heterostructure is configured such that a separation energy between the upper and lower energy states in the first region under forward bias equals or slightly exceeds a separation energy between the upper and lower energy states in the second region under reverse bias by a delta separation energy such that under reverse bias in each stage of the second region the upper energy state is "near" the top of the quantum well in energy and is localized in the quantum well to overlap with the lower energy state such that the upper energy states moves into an avalanche multiplication region of the APD to detect echo photons in the negative x direction in a receive mode. The closer the echo photon energy is to the APD's detection transition, the higher the probability the echo photon has of being detected. Critically, for the same heterostructure the upper energy state must (a) be strictly confined to the quantum well under forward bias in order to lase and (b) near the top of the quantum well in energy and localized in the well to spatially overlap with the lower energy state under reverse bias to detect the echo photon.

In different embodiments, the reverse biased APD's upper energy state is either confined just below the top of the quantum well or lies just above the quantum well in the continuum states and is quasi-localized.

In a 3-state system, in the forward biased first region lasing occurs from state E3→E2 while the E2→E1 transition is tuned to a phonon energy to depopulate state E2 so that E2 can accept an electron from the E3→E2 transition. To detect the E3→E2 energy that was transmitted in an echo photon, under reverse bias of the second region the new energy position of E1, E2 and E3 moves such that absorption of the echo photon puts an electron in an uppermost state E3 of the quantum well that is near the top quantum well and localized in the well. An echo photon is absorbed and promotes an electron to the upper energy state E3 where it is injected into the APD's reverse bias depletion field and is detected. If E3 is confined too deeply below the top of the quantum well, the promoted electron will not be injected and thus not detected. If E3 is too far above the top of the quantum well it won't have the correct energy to be localized.

In different embodiments, the heterostructure is configured to provide the delta separation energy to position the upper energy state near the top of and localized in the quantum well under reverse bias by one or more of "asymmetric" stages, additional MQW stages in the $2^{nd}$ region or reversing the polarity of the APD's p-n junction. In different embodiments, the QCL and APD may be configured in an end-to-end relationship in which photons are emitted and received at the same surface but echo photons must pass through the first (QCL) region to reach the second (APD) region, a side-by-side relationship in which photons are emitted and detected at different surfaces and a common relationship in which a common region of the heterostructure provides both the first and second regions.

In an end-to-end configuration, in receive mode the forward bias applied to the first region is reduced below the threshold for lasing to allow echo photons to pass and the mirror that forms the end of the laser cavity between the QCL and APD is switchable to allow the echo photons to pass and enter the second region. The "switchable" mirror may be implemented with top and bottom metal contacts that sandwich a region of the heterostructure to form a m-i-m semiconductor between the first and second regions.

In a side-by-side configuration, the QCL and APD may be isolated by either etching the heterostructure to the common substrate to physically separate the devices or by applying a bias to top and bottom contacts that sandwich a region of the heterostructure to form a m-i-m semiconductor between the QCL and APD to optically separate the devices. In an embodiment, a second QCL may be formed adjacent and optically coupled to the first QCL. In such an arrangement, the heterostructure may be formed from a "spintronic" material and a magnetic (B) field applied to either the optical coupling structure or one of the QCLs. In another embodiment, a second QCL may be formed in an end-to-end relationship to pump the first QCL. The pump may be tuned to one-half the lasing energy of the first QCL to encourage two photon absorption and thus two photon emission.

In different embodiments, the QCL is configured for continuous wave (CW) emission or pulsed emission via Q-switching.

In different embodiments, the QCL and/or APD may be configured to tune the emission and detection wavelength. Metal contacts placed above and below the heterostructure on either side of the first region form the mirrors that define the laser cavity. At least one, and preferably all of the contacts being gratings that include multiple spaced fingers. Selective excitation of the fingers tunes the cavity length, hence the emission wavelength. For example, the Tx/Rx can be tuned to 4.6 microns, which is a low absorption window in the atmosphere. In an embodiment, the APD can be provided with a notch filter to remove echo photons above or below the energy level (wavelength) of the transmitted photon. The surface that receives echo photons may be formed with an optical coating (or another external optic) that provides a low-pass filter to remove echo photons above the desired energy. The gratings are tuned to provide a high-pass filter to remove echo photons below the desired energy.

These and other features and advantages of the invention will be apparent to those skilled in the art from the following detailed description of preferred embodiments, taken together with the accompanying drawings, in which:

DETAILED DESCRIPTION OF THE INVENTION

Figure 1A:
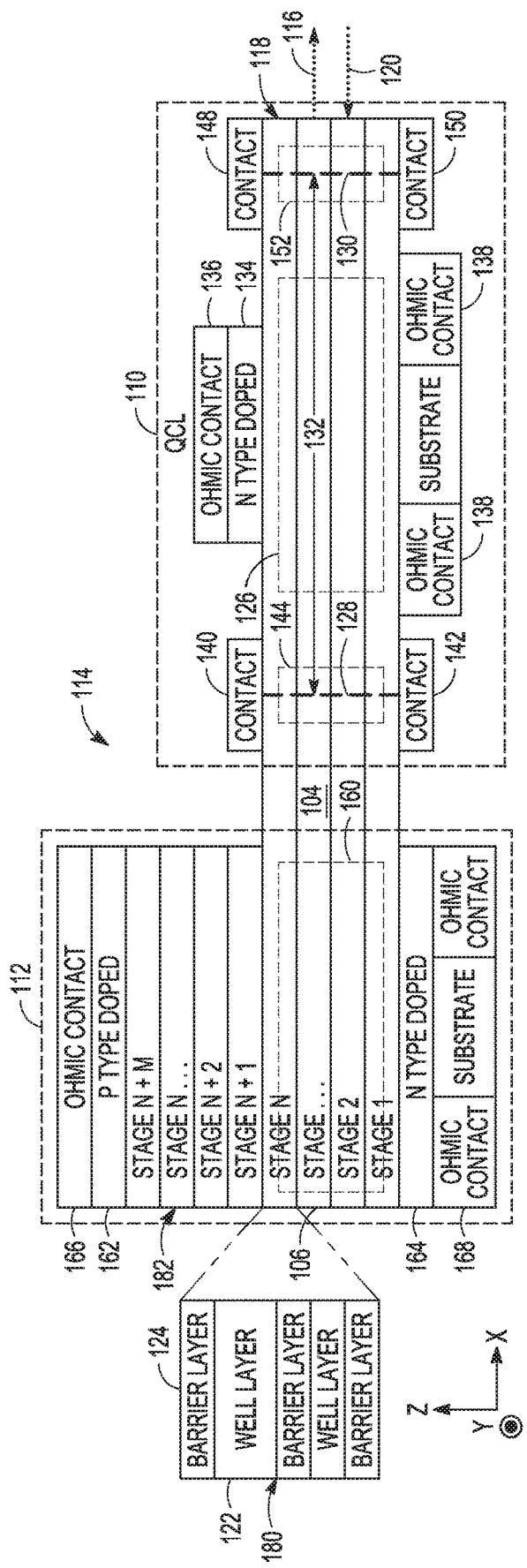
FIGS. 1a-1b are side and end views of an end-to-end embodiment of a monolithically integrated QCL/APD Tx/Rx.
Figure 1B:
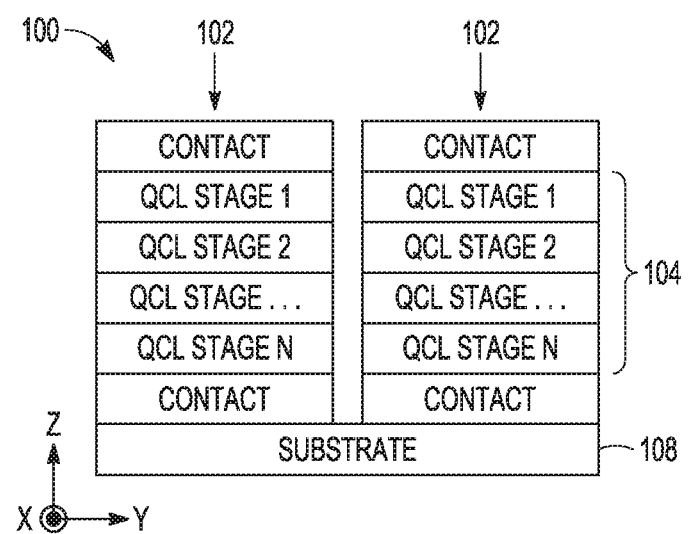

The present invention provides for a monolithic QCL/APD IR Transceiver in which the QCL transmitter and APD receiver have the same N MQW stage composition and variation in thickness in the z direction for all positions in x and y directions. In other words, the QCL and APD are formed from the same intrinsic (i) semiconductor heterostructure including N Multiple Quantum (MQW) stages. The heterostructure is configured via asymmetric stages, additional stages for the APD or by reversing the polarity of the p-n junction for the APD or a combination thereof such that the upper energy state in the QCL under forward bias is confined to the quantum well and the upper energy state in the APD under reverse bias is "near" the top of the quantum well in energy and localized in the well to spatially overlap with the lower energy state, which is a pre-requisite for the lower energy state to absorb a photon and be promoted to the upper energy state. After absorption, in order for the upper energy state to move into an avalanche multiplication region of the APD and be detected outside the well, the wavefunction in the upper energy state must also have a portion of its wavefunction in the barrier region.

As used herein, "near" the top of the quantum well means that the shape of the wavefunction for the upper energy state spatially overlaps with the ground state and exhibits a high probability of tunneling through the barrier layer. This occurs either if the upper energy state is confined just below the top of the quantum well where the wavefunction is a slowly decaying exponential or if the upper energy state lies in the continuum states just above the top of the quantum well where the wavefunction is a sinusoid and has the correct energy to quasi-localize. In either case, the wavefunction is localized in the quantum well. If the upper energy state is confined too deeply within the well, the APD can absorb the photon, but the wavefunction will decay rapidly and the electrons will have a low probability of tunneling through the barrier layer to be detected. If the upper energy state is in the continuum but does not have the correct energy to quasi-localize, it won't have a high probability of being absorbed, because there will not be sufficient spatial overlap with the lower energy state. The upper U or E3 state is "quasi-localized" in the continuum to increase the spatial overlap with L or E2 needed for absorption from the lower confined state L or E2 to the upper U or E3 continuum state to occur with a sufficiently high probability that it gets absorbed in the APD.

It is important to note that one cannot take a typical intrinsic (i) semiconductor heterostructure that is designed to operate as a QCL under forward bias and simply form a p-n junction around another identical portion of the heterostructure to define an APD, reverse bias the p-n junction and expect the APD to function properly. In such a structure, the upper energy state in the APD under reverse bias would be well below the top of the barrier well and remain confined to the quantum well. Echo photons would be absorbed and populate the upper U or E3 state that is confined in the well and go undetected. Simply increasing the reverse bias does not position the upper energy state near the top of the barrier well or ensure quasi-localization of the upper energy state if in the continuum states. The heterostructure and APD device must be specifically configured to position the upper energy state near the top of the well under reverse bias while strictly confining the upper state to the quantum well under forward bias to function properly.

Referring now to FIGS. 1a-1b, 2a-2c, 3 and 4, in an embodiment an array 100 of L QCL/APD transceivers 102 are monolithically fabricated from an intrinsic (i) semiconductor heterostructure 104 including N Multiple Quantum Well (MQW) stages 106 on a common substrate 108 where L=2 in this example. In this embodiment, each transceiver includes a QCL 110 and an APD 112 that coexist end-to-end in a single waveguide 114 in the x-direction. The QCL and APD have the same N MQW stage composition and variation in thickness in the z direction for all positions in x and y directions. In other words, the QCL and APD are monolithically fabricated from the same heterostructure on a common substrate.

QCL 110 emits photons 116 in a positive x direction at a surface 118 in a YZ plane. The QCL generally emits in the IR at 3-15 microns and can be tuned to emit at a specified wavelength. "Echo" photons 120, which are photons 116 emitted by the QCL and reflected off of a target are incident upon surface 118. As will be described more fully, the echo photons 120 are preferably filtered to only pass those photons of the specified wavelength and allowed to pass through the QCL portion of the heterostructure 104 where they are detected by APD 112, which can itself be tuned to the specified wavelength.

Figure 2A:
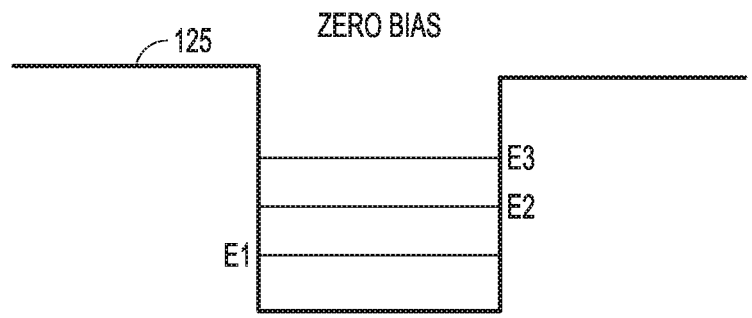
FIGS. 2a through 2c are band diagrams of an embodiment for the unbiased heterostructure, the forward biased QCL region in which the upper energy level is confined to the quantum well and the reverse biased APD region in which the upper energy level is positioned near the top of the quantum well in energy and localized within the well.

In the heterostructure 104, each of the N stages is identical and comprises alternating quantum well layers 122 and thin barrier layers 124. In a symmetric structure, all of the quantum well layers 116 have the same thickness such that each MQW state is "symmetric" about a center position of the stage in the z direction. In an asymmetric structure, the thickness of the quantum well layers 116 varies such that each MQW state is "asymmetric" about a center position of the stage in the z direction. The heterostructure defines at least upper (U) and lower (L) energy states and a quantum well in each stage. In the typical three-level system, the heterostructure defines E1, E2 and E3. As shown in FIG. 2a, when unbiased, the U and L energy states or, more particularly, E1, E2 and E3 are all confined in a quantum well 125

Figure 2B:
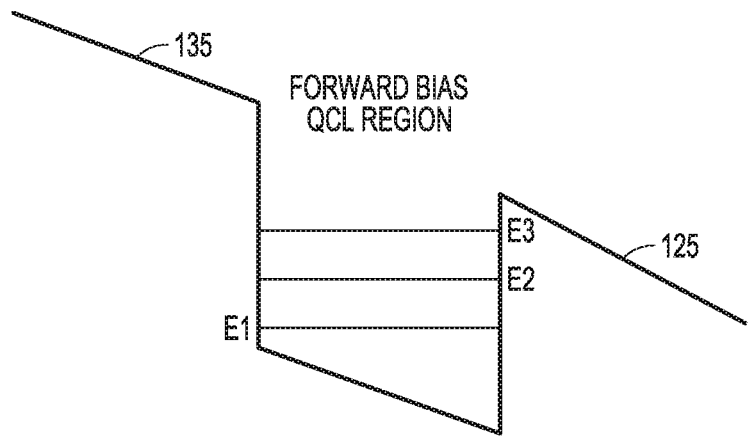

QCL 110 includes a first region 126 of the heterostructure sandwiched between first and second "mirrors" 128 and 130 oriented in a z-direction and separated in an x-direction to form a laser cavity 132 and an n type doping layer 134 above (or below) the laser cavity to inject electrons into the adjacent MQW stage 106. As shown in FIG. 2b, first region 126 is responsive to application of a forward bias 135 to ohmic contacts 136 and 138 such that the upper and lower energy states (or E1, E2 and E3) in each MQW stage are strictly confined in the quantum wells 125 to induce intersubband lasing transitions in each of the MQW stages that contribute to a photon gain of the cavity to emit photons 116 at a first IR wavelength in a positive x direction in a transmit mode.

In the simplest configuration of a QCL, mirrors 128 and 130 could be formed by cleaving the ends of the first region 126 of the heterostructure and forming reflective optical coatings on the ends. The left hand mirror 128 would be 100% reflective and the right hand mirror <100% reflective to form laser cavity 132 and emit a continuous wave (CW) laser.

In the end-to-end configuration, echo photons must pass through the $1^{st}$ region and mirror 128 to reach the APD. To do so, at least mirror 128 must be "switchable" between providing a mirror in transmit mode and allowing the echo photons to pass in receive mode. In an embodiment, a switchable mirror 128 includes top and bottom metal contacts 140 and 142 that sandwich a first mirror region 144 of the heterostructure to form a m-i-m semiconductor. A bias applied between contacts 140 and 142 creates an electric field in the heterostructure that changes both the complex and real parts of a refractive index of the heterostructure in the first mirror region 144 to alternately insert and remove a mirror.

In this embodiment, the QCL is configured to both tune the laser cavity to precisely select the emission wavelength and to Q-switch the laser cavity to emit high amplitude pulses. To Q-switch the QCL, right hand mirror 130 is also formed as a switchable mirror 130 including top and bottom metal contacts 148 and 150 that sandwich a second mirror region 152 of the heterostructure to form a m-i-m semiconductor. When in a low Q state, the heterostructure is pumped until the stored energy reaches a maximum. The mirror is then switched to a high Q state allowing feedback and laser emission in a short pulse with very high intensity.

Figure 3:
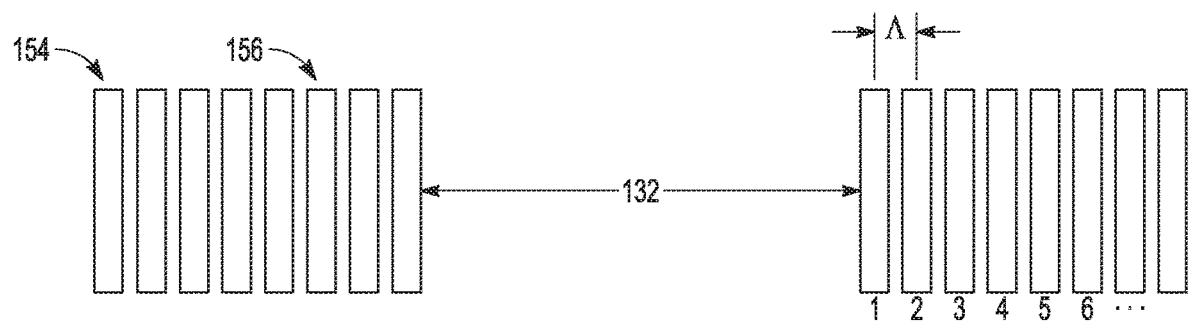
FIG. 3 is a top view of an embodiment of a metal Bragg grating contact responsive to application of a bias to selectively tune the laser cavity, filter out low energy echo photons and/or Q-switch the QCL.

As shown in FIG. 3, to tune the laser cavity, at least one and preferably all of the metal contacts 140, 142, 148 and 150 is formed as a Bragg grating 154 with a plurality of equally spaced fingers 156. Selective application of a bias to fingers 156 changes the length of the laser cavity thereby tuning the emission wavelength. The bandwidth of the spectral response of a Bragg Mirror's reflectivity can be tuned (without changing the peak wavelength of the reflectance) by changing the difference in index between the finger regions and the unbiased regions. That is, without changing which fingers of the Bragg Mirror are energized, the bandwidth of the cavity can be changed by increasing/decreasing the voltage on the fingers.

The slabs/fingers in the Q-switch regions create effects optically when bias is applied. More precisely, they apply an electric field in the z direction of the structure, which has the effect of shifting the difference in energy (deltaNM) between the Nth and Mth subband confinement states of the multiple quantum wells grown in the z direction. Semiconductor materials exhibit stark shifts in energy with an applied electric field—but these shift are small for pure/homogenous materials. The shifts in deltaNM, however, in the confined subband states of the semiconductor heterostructure are much larger. As more voltage is applied to a forward biased diode laser (including the QCL described herein), the equilibrium action of the laser is to increase light output by depleting the larger numbers of carriers injected into the active region so as to keep the density of charge carriers constant. For this reason, the contacts applied to the Q-switch region do not have n/p doping layers, and this permits tuning the energy separations deltaNM, and thus allows for the electrical tuning of the index of refraction from the effect that deltaNM has on resonant contributions to the dielectric function. The Fabry-Perot slabs and Bragg Mirrors work on differences in the index of refraction in the biased regions.

Figure 2C:
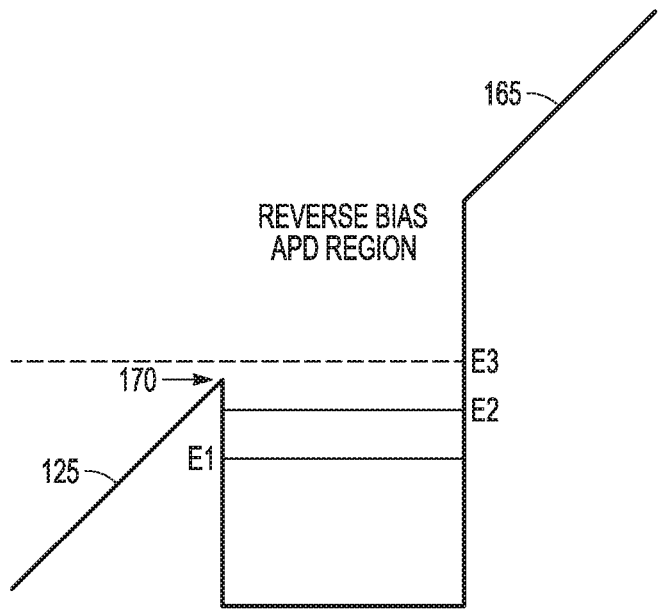
Figure 4:
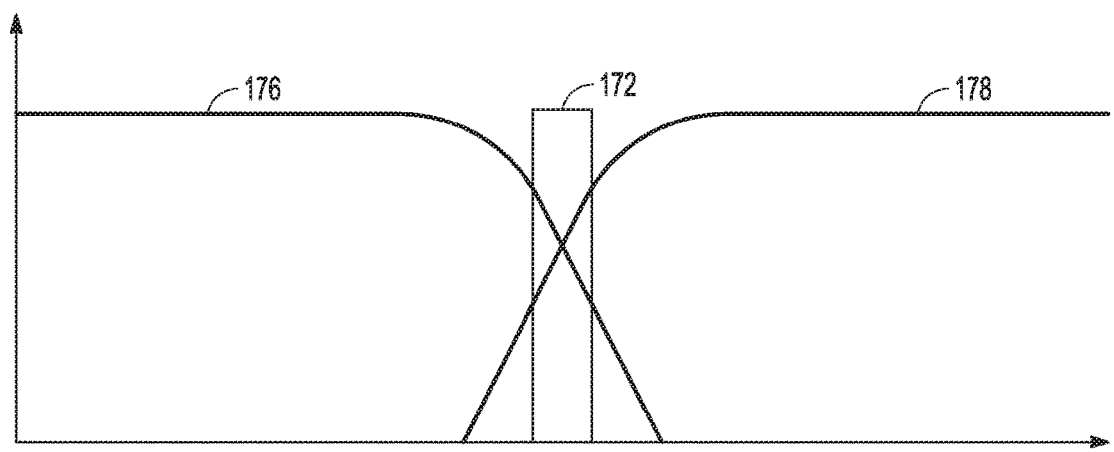
FIG. 4 is a plot of an embodiment a "notch" filter to pass echo photons through the QCL and the APD, which is formed by an optical coating on an exposed surface that forms a low-pass filter and the tunable grating contacts that form a high-pass filter.

APD 112 includes a second region 160 of the heterostructure sandwiched between second p and n type doping layers 162 and 164 in the z-direction that form a p-i-n semiconductor. As shown in FIG. 2c, second region 160 is responsive to application of a reverse bias 165 to ohmic contacts 166 and 168 such that in each stage 106 of the second region the lower energy state U (or E1 and E2) is confined to the quantum well 125 and the upper energy state U (or E3) is slightly above the top 170 of the quantum well and quasi-localized such that the upper energy states move into an avalanche multiplication region of the APD to detect echo photons at the first IR wavelength incident in the negative x direction in a receive mode. Designing and biasing the heterostructure such that U (or E3) is positioned just above the top of the quantum well and quasi-localized is generally preferred to improve detection. However, as previously explained, position U (or E3) just below the top of the quantum well will work. Note, in receive mode the amount of forward bias applied to the QCL is reduced such that the QCL is in a state of population inversion and gain but below the threshold for lasing to allow echo photons to pass through the first region to the second region. The reduced forward bias balances gain/loss in the laser cavity, if possible exactly zero so that the incoming echo photon is amplified as it pushes the laser cavity across the threshold for lasing purely by photo-injection, and not by bias—but in a way that doesn't create false alarms in the detector In an embodiment, as shown in FIG. 4 the APD can be provided with a notch filter 172 to remove echo photons above or below the energy level (wavelength) of the transmitted photon. The surface 118 that receives echo photons 120 may be formed with an optical coating (or provided with an external optic) that provides a low-pass filter 176 to remove echo photons above the desired energy. The Bragg gratings are tuned to provide a high-pass filter 178 to remove echo photons below the desired energy. The result of combining the LPF and HPF is the notch filter 172. As such, the APD can very precisely detect and count only echo photons.

In order for the integrated QCL/APD to function properly as a laser that emits photons at a particular energy/wavelength and receives and detects the echo photons at the particular energy/wavelength, the monolithic intrinsic heterostructure is configured such that a separation energy between the upper and lower energy states in the first region under forward bias equals or slightly exceeds a separation energy between the upper and lower energy states in the second region under reverse bias by a delta separation energy. For a three-level system, E3-E2 under forward bias >E3-E2 under reverse bias by a prescribed $\Delta E32$, which under reverse bias positions E3 slightly above the top of the quantum well at the correct energy for quasi-localization or slight below the top of the quantum well in a confined state. This allows the echo photon to be absorbed and promote an electron to E3 where it moves into the avalanche multiplication region of the APD.

Quantum physics says that the electrons confined in the well will have discrete energies, while electrons at energies above the top of the quantum well are in a continuum; they are free to assume any energy value. In any layer of the structure, if the energy of the electron is below the sum of the unbiased heterostructure layer plus the applied voltage that layer is a barrier layer and the electron's wavefunction has an exponentially decaying tail there, otherwise the electronic wavefunction will be a sinusoid. For discrete energies in the continuum, when the wavelength of the electron is a multiple of a quantum well's width, its sinusoid will exactly fit into the well, which "quasi-localizes" the electron in the well.

The prescribed delta separation energy can be designed into the heterostructure using one or more of "asymmetric" stages, additional MQW stages in the $2^{nd}$ region of the APD or reversing the polarity of the APD's p-n junction each of which is depicted in FIG. 1a.

As shown, each MQW stage 106 comprises alternating quantum well layers 122 and thin barrier layers 124 in which the thickness of the quantum well layers varies such that each MQW state is asymmetric about a center position 180 of the stage in the z direction. Within a stage the quantum well layers couple through the thin barrier layers. As a result, the stage behaves different under forward and reverse bias. Proper design of the identical stages of the heterostructure produces the delta separation energy required to both confine the upper energy state in the quantum well under forward bias and to position the upper energy state near the top of the quantum well under reverse bias.

Each QCL stage has a set of quantum wells that are coupled between thin barrier layers. When two quantum wells are isolated by thick barrier layers, the allowable energies in those wells can be computed in isolation without considering the effect of coupling between wells. Thicker wells confine more states and have smaller energy separation than thin wells. The designer can choose an asymmetric structure (thick wells coupled to adjacent thin wells) which, upon examining FIGS. 2b and 2c, allows the different bias conditions to pick which side is most affected by the bias (one side's well height is reduced while the other side's well height is increased by the bias).

As also shown, APD 112 includes an additional M MQW stages 182 formed on top of the N MQW stages 106 from the common heterostructure. The voltage applied under reverse bias of an APD is considerably higher than the voltage applied under forward bias to make the QCL lase e.g., 100 V vs 5 V. The additional M MQW stages reduce the voltage drop across each of the N+M MQW stages in reverse bias, which in turn reduces the "tilt" shown in FIG. 2c. Selection and design of the stages provides the delta separation energy. Controlling the voltage dropped across each stage helps the designer to control the position of E3 relative to the top of the well.

As also shown, the polarity of the APD's p-n junction is reversed with respect to the QCL. The n type layer 164 is formed beneath the common heterostructure whereas the n type layer 134 is formed above the common heterostructure (or vice-versa). Every p/n junction without bias creates a built-in field, or a "voltage tilt". Flipping the polarity of the p/n junction, flips the direction of the voltage tilt between the forward and reverse bias conditions, and when used with asymmetry in the stages, offers the designer more control over the design of the E3 energy position relative to the top of the well.

Figure 5:
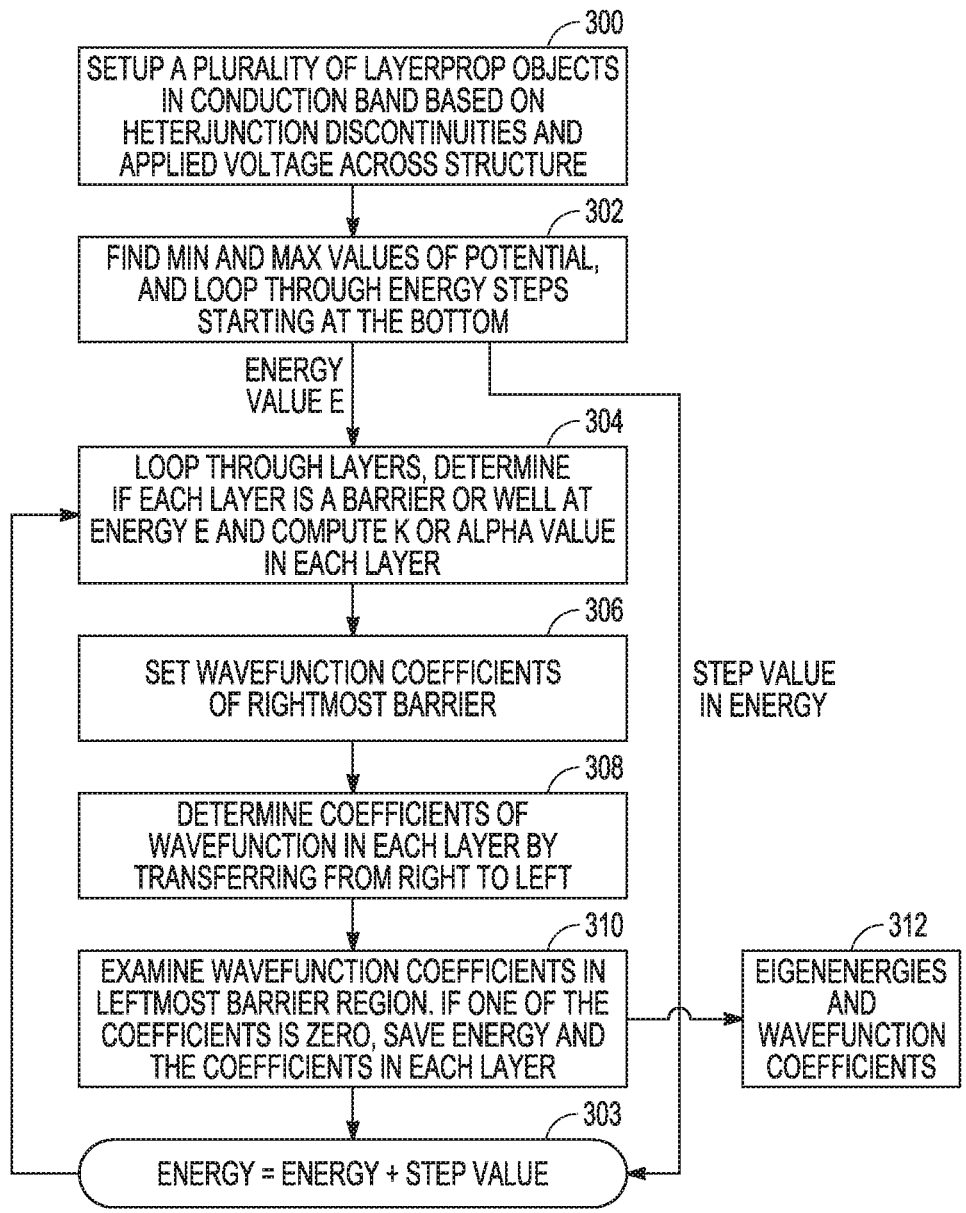
FIG. 5 is a flow diagram of an embodiment for testing a design the monolithic intrinsic (i) semiconductor heterostructure including N Multiple Quantum Well (MQW) stages.

FIG. 5 is a flow diagram an embodiment for testing a design of the monolithic intrinsic (i) semiconductor heterostructure for a combination of one or more of asymmetric stages, M additional stages for the APD or reversing the polarity of the APD's p-n junction to see if the design satisfies the constraint that the upper energy state is confined in the quantum well under forward bias and the upper energy state is near the top of the quantum well under reverse bias.

A designer starts with an initial structure for one stage (initially a single quantum well (SQW) in isolation with a given thickness), that later is used as a starting thickness for two symmetric wells where the effect of coupling on the initially isolated SQW states can be examined as the barrier between the wells is reduced without bias. The height of the conduction band wells at zero bias is based on known heterojunction discontinuities. At step 300 of the computation, the designer has selected the material system, the number of heterojunctions, and chooses an applied voltage. For example a three-layer quantum well (barrier-well-barrier) has two heterojunction interfaces. Material systems for the heterostructure may include but are not limited to HgCdTe (Mercury-Cadmium-Telluride), AlInAsSb (Aluminum-Indium-Arsenide-Antimony) and GaInAsSb (Gallium-Indium-Arsenide-Antimony). At step 300, the designer submits a proposed design of the heterostructure e.g., symmetric of asymmetric, number of stages, composition of each identical stage, whether it includes additional MQW stages in the APD, whether the p/n junction of the APD is reversed etc; and the entire process of the flow diagram is executed for a forward bias voltage and a reverse bias voltage.

In step 302, the minimum and maximum values of the sum of the unbiased heterojunctions plus the applied voltage is ascertained to constrain the energy search boundary. In step 303, the energy is incremented by a step value. The step value is the maximum minus the minimum divided by a number of energy steps.

Steps 304, 306, 308 and 310 collectively compute the "bound states" and step 312 outputs the energies from that computation in the form of eigenenergies and wavefunction coefficients. In this embodiment, the wavefunction in a given layer n, is either a sinusoid in a well, because the proposed energy step places it above the sum of the unbiased layer potential plus the applied potential, (WF=Cn*cos (k*x)+Dn*sin(k*x)), or an exponentially decaying function in a barrier (WF=An*exp(-alpha*x)+Bn*exp(alpha*x)). The computation for getting bound states out starts with an assumed set of C1 & D1 coefficients in a rightmost barrier layer (step 306), and applies continuity of the wavefunction and derivative at each heterojunction interface, going from rightmost layer to leftmost layer, where coefficients in the (n+1)th layer are determined from the coefficients in the nth layer. Step 304 sets an assumed energy and goes through the layers of the structure to compute A&B (barrier) and C&D (well) at that energy for each layer. After step 306, step 308 determines coefficients of the wavefunction in each layer by transferring from right to left. Step 310 examines wavefunction coefficients in the leftmost barrier region; and if the B of the coefficients is zero, it saves the energy and the coefficients in each layer. If the B coefficient isn't zero in the leftmost barrier that says the wavefunction is exponentially growing in a barrier (Bexp(alpha*x)) and that is not the way bound states behave.

The designer verifies whether the eigenenergies and wavefunction coefficients output in step 312 for both the forward bias and reverse bias satisfy the constraint that the upper energy state is confined in the quantum well under forward bias and the upper energy state is near to the top of the quantum well (e.g. slightly below in a confined state or slightly above in a continuum state that is quasi-localized) under reverse bias. If both conditions are met, the heterostructure design is acceptable. If not, the designer modifies the stage construction, number of stages, whether additional stages for APD and whether p/n is reversed to produce a new design for the heterostructure, which is then tested under forward and reverse bias. The process repeats until a viable design is identified.

In other embodiments, the QCL and APD are fabricated from the monolithic intrinsic (i) semiconductor heterostructure to exist in side-by-side waveguides oriented in the x direction and separated in the y direction. Photons emitted in the positive x direction by the forward biased QCL return as echo photons in the negative x direction and are detected by the reverse biased APD. The QCL and APD still have the same N MQW stage composition and variation thickness in the z direction for all positions the in the x and y directions. The design of the heterostructure via asymmetry, additional MQW stages in the APD or reversing of the polarity of the APD's p-n junction must still satisfy the criteria that under forward bias the upper state (U or E3) must be strictly confined to the quantum well and under reverse bias the upper state (U or E3) must be near the top of the quantum well. The side-by-side arrangement has the advantage that echo photons do not have to pass through the QCL to reach the APD. This allows for optimization of each device as to Q-switching, tuning and filtering.

Figure 6:
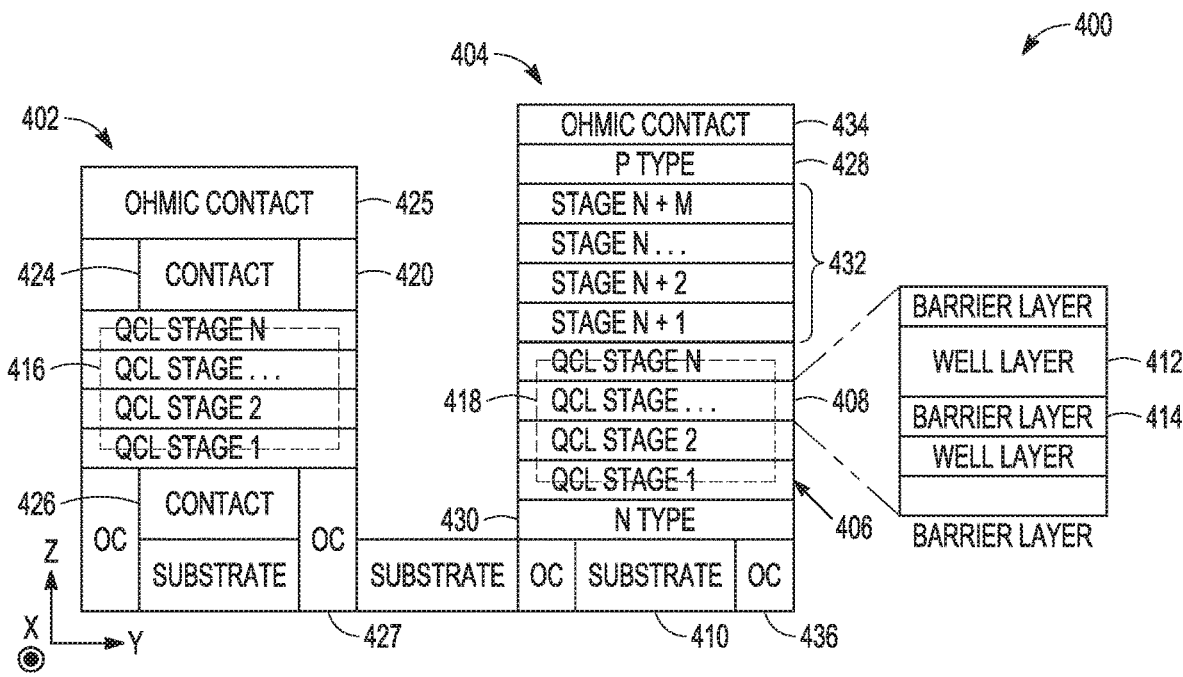
FIG. 6 is an end view of a side-by-side embodiment of a monolithically integrated QCL/APD Tx/Rx in which the QCL and APD are isolated by etching the heterostructure down to the common substrate.

Referring now to FIG. 6, in an embodiment a QCL/APD transceiver 400 includes a QCL 402 and an APD 404 are monolithically fabricated from an intrinsic (i) semiconductor heterostructure 406 including N Multiple Quantum Well (MQW) stages 408 on a common substrate 410. As shown, each stage 408 is asymmetric having varying thickness quantum well layers 412 separated by thin barrier layers 414. The heterostructure 406 is etched to the substrate to isolate first and second regions 416 and 418 of the heterostructure.

QCL 402 includes an n type layer 420 positioned above first region 416 to inject electrons into the top stage. Metal Bragg grating contacts 424 and 426 are formed above and below and at either end of first region 412. As previously described, the application of a bias voltage to the grating contacts can serve multiple functions including to form mirrors based on the electric field in the heterostructure to define the laser cavity and to adjust the length of the laser cavity to tune the emission wavelength. A bias is applied to ohmic contacts 424 and 426 to forward bias the first region 416 to lase.

APD 404 includes p and n type layers 428 and 430 positioned above and below second region 418. As shown, the polarity of p and n type layers is switched with respect to the QCL and the device includes an additional M MQW stages 432. A bias is applied to ohmic contacts 434 and 436 to reverse bias the second region 424 to detect echo photons.

Figure 7:
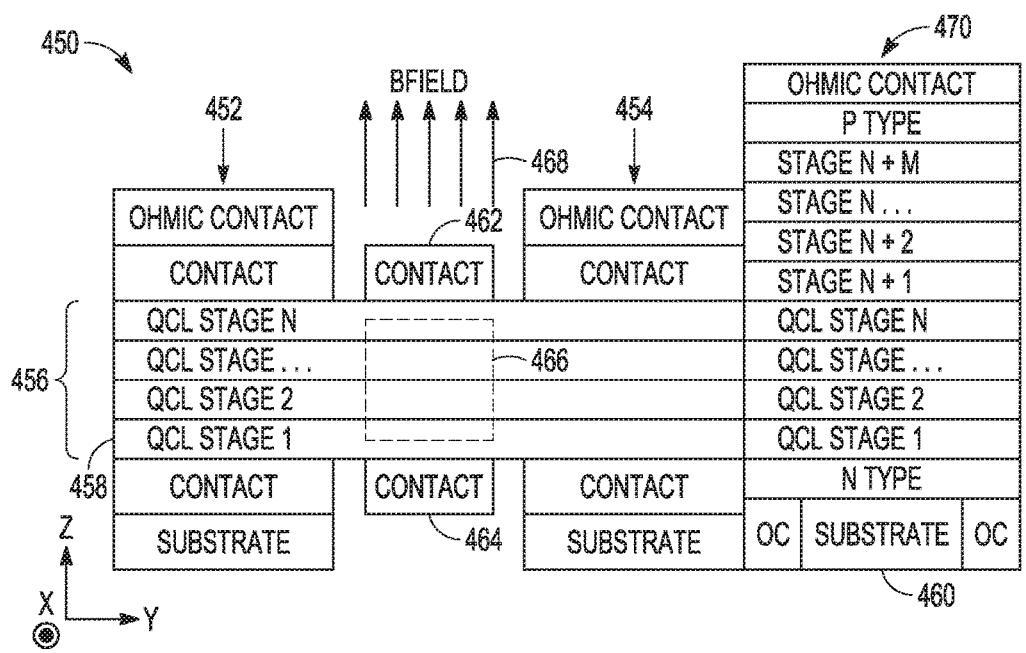
FIG. 7 is an end view of a side-by-side embodiment of a monolithically integrated QCL/APD Tx/Rx in which first and second QCL are optically coupled by application of electric (E) and magnetic (B) fields to the heterostructure separating the two and an APD.

Referring now to FIG. 7, an embodiment of a QCL/APD transceiver 450 includes a pair of QCLs 452 and 454 monolithically fabricated side-by-side from an intrinsic (i) semiconductor heterostructure 456 including N Multiple Quantum Well (MQW) stages 458 on a common substrate 460. Metal contacts 462 and 464 are positioned above and below the heterostructure to form a m-i-m semiconductor 466 between the pair of QCLs. The semiconductor is responsive to a bias to modify the refractive index of the heterostructure to control lateral coupling between the QCLs. The QCLs may be completely isolated or partially coupled. In an embodiment, the heterostructure is comprised of a spintronic material. A source such as an electrically stimulated solenoid applies a magnetic (B) field 468 in the z direction at a specified position in the y direction to either the metal contacts 462 and 464 or one of the first and second QCLs whereby a combination of electric and magnetic fields control the optical coupling. An APD 470 is fabricated from the same heterostructure 456 side-by-side with the QCLs. The APD may be isolated via etching or optical coupling.

Figure 8:
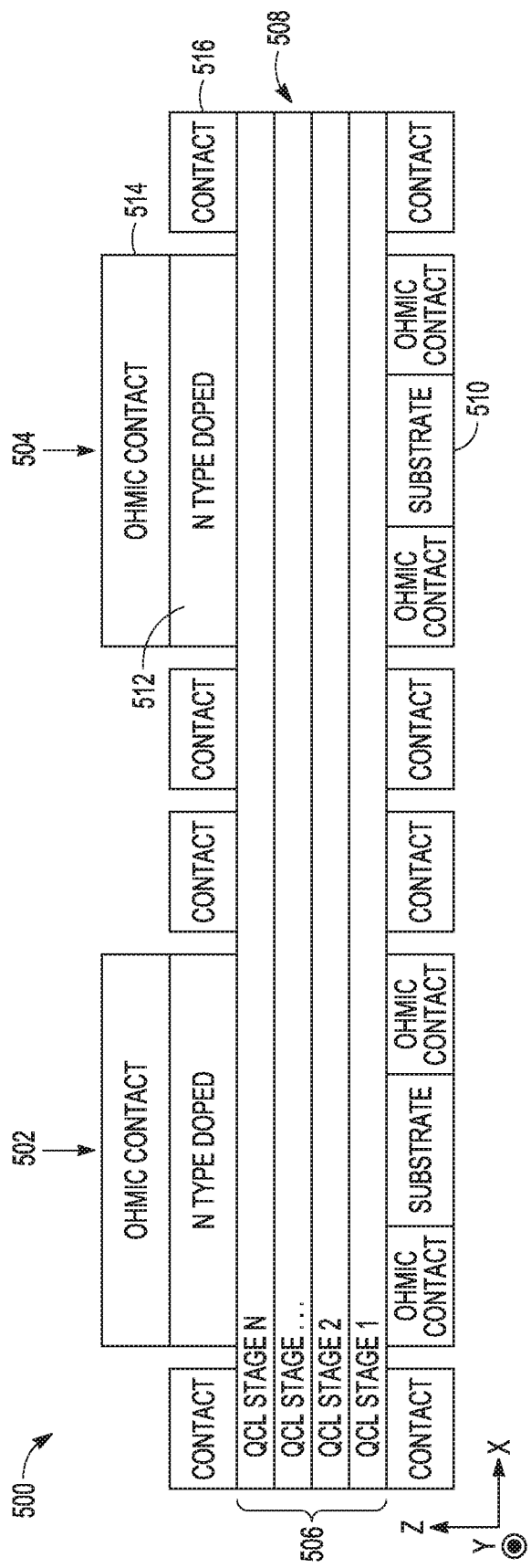
FIG. 8 is a side view of an embodiment of end-to-end QCLs in which a $1^{st}$ QCL is configured to pump the $2^{nd}$ QCL.

Referring now to FIG. 8, an embodiment of a QCL/APD transceiver 500 includes a pair of QCLs 502 and 504 monolithically fabricated end-to-end from an intrinsic (i) semiconductor heterostructure 506 including N Multiple Quantum Well (MQW) stages 508 on a common substrate 510. QCL 502 is configured to "pump" QCL 504.

Accordingly, QCL 502 is tuned to lase at a pump wavelength to excite laser emission of QCL 504 at a different IR wavelength. Each QCL includes an n type layer 512 and metal contacts 514 to receive a bias to forward bias the device. Additionally, each QCL includes metal Bragg grating contacts 516 responsive to selective application of bias to the fingers of the gratings to form and tune the laser cavities to emit at a particular wavelength.

In a particular embodiment, pump QCL 502 is tuned to one-half the energy separation of the upper and lower energy main lasing states in the transmit QCL 504 e.g., the pump emits at twice the wavelength as the transmit QCL. This encourages two photon absorption. A Fabry Perot cavity exhibits spectral mainlobe and sidelobe reflectance. The mainlobe encourages emission of one photon between the main upper and lower lasing states while feedback from the sidelobes encourages an emission of two photons (at slightly different energy) producing a $2^{nd}$ energy emission band (split into two lines that are closely spaced in energy) which is at half the energy of the main emission band from transmit QCL 504. In an embodiment, the QCL may be tuned such that the first and second energy bands overlap with 4.6 and 10 microns (specifically 9.2 micron) absorption windows in the atmosphere. The two closely spaced energies in the $2^{nd}$ emission subband may be entangled by external optics for use in a quantum lidar. An APD (not shown) would be fabricated from the same heterostructure side-by-side with transceiver 500.

The process for emitting two photons from a semiconductor heterostructure is more efficient than for 2 photon emission in a non-linear optic crystal, but the process for how the 2 photons are used in detection is the same as described in U.S. Patent Publication 2010/0177297A1, i.e.—one of the photon is the echo photon which correlates with the other photon referred to as an idler photon. The idler photon must be time delayed to account for the range delay of the echo. This can be done, for example, by passing it through an external fiber optic cavity of a fixed length, whose optical path length can be controlled by changing the index of refraction of the cavity. The idler and echo photons are entangled/correlated (one method for creating entanglement between the two photons involves passing the two photons through external optics), through a measureable like polarization to selectively mix only with each other in a mixer. Mixers for traditional radars utilize the non-linear response of a diode's I-V curve. The APD's response can be adjusted to be slightly non-linear in reverse bias, which allows the Doppler of the two photons to be mixed by the APD. There are strategies involving the use of laser Doppler vibrometers in external optics to facilitate this process.

Figure 9:
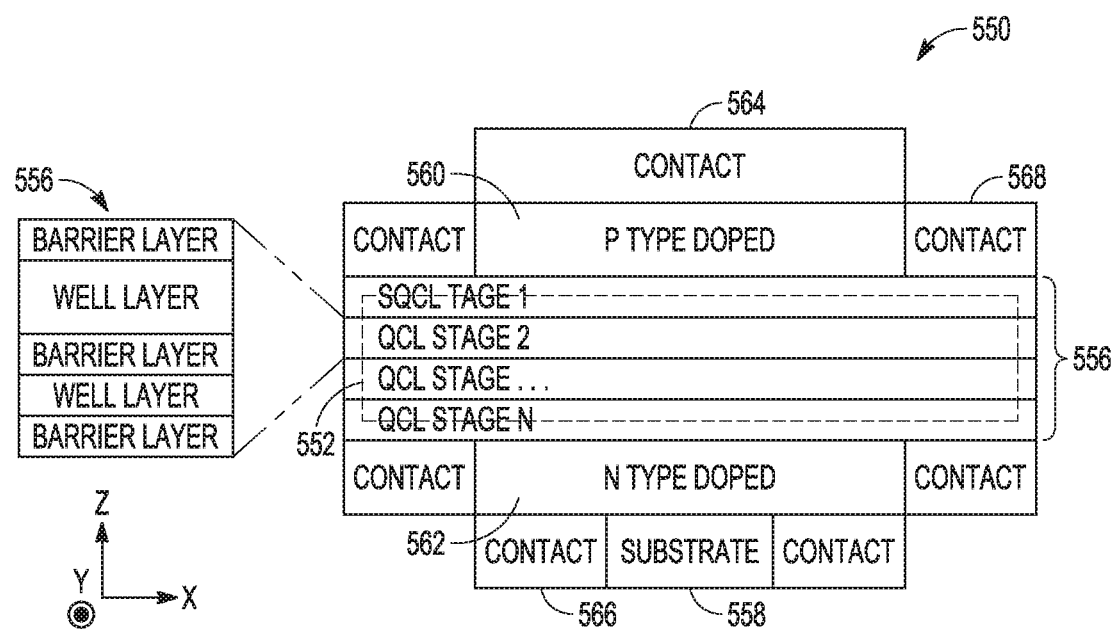
FIG. 9 is a side view of an embodiment of a common QCL/APD Tx/Rx.

Referring now to FIG. 9, an embodiment of a QCL/APD transceiver 550 is monolithically fabricated in a common region 552 of an intrinsic (i) semiconductor heterostructure 554 including N Multiple Quantum Well (MQW) stages 556 on a substrate 558. P and n type layers 560 and 562 are fabricated above and below common region 552. Metal contacts 564 and 566 are used to apply bias to the p and n type layers and the device. The n type layer serves to inject electrons into the top stage of the heterostructure under forward bias to support lasing. The p and n type layers form the p-n junction of the APD to detect echo photons under reverse bias. The device is suitably provided with metal Bragg grating contacts 568, which are responsive to application of a bias to form and tune a laser cavity when the device is under forward bias to lase and emit photons at a specified wavelength. The metal Bragg grating contacts 568 are responsive to application of a bias to form a notch filter in combination with external optics when the device is under reverse bias to detect echo photons at the specified wavelength. In this common configuration, the heterostructure is designed with asymmetric stages 556 to confine the upper state (U or E3) in the quantum well under forward bias to sustain lasing and to position the upper state (U or E3) near the top of the quantum well under reverse bias to detect the echo photons. The p-type layer changes the built-in potential for the unbiased QCL, which requires further design considerations.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:
1. A monolithic infrared transceiver, comprising:
   a monolithic intrinsic (i) semiconductor heterostructure including N Multiple Quantum Well (MQW) stages;
   a first region of the heterostructure sandwiched between first and second mirrors oriented in a z-direction and separated in an x-direction to form a laser cavity and an n type doping layer above the laser cavity to inject electrons into a first MQW stage in which the heterostructure defines at least upper and lower energy states and a quantum well in each stage of a first quantum cascade laser (QCL), said first region responsive to application of a forward bias such that the upper and lower energy states in each MQW stage are confined in the quantum wells to induce intersubband lasing transitions in each of the MQW stages that contribute to a photon gain of the cavity to emit photons at a first IR wavelength in a positive x direction in a transmit mode; and
   a second region of the heterostructure sandwiched between second p and n type doping layers in the z-direction that form a p-i-n semiconductor in which the heterostructure defines at least upper and lower energy states and a quantum well in each stage of an avalanche photodiode (APD),
   wherein said first and second regions have the same N MQW stage composition and variation in thickness in the z direction for all positions in x and y directions;
   wherein said monolithic intrinsic heterostructure is configured such that a separation energy between the upper and lower energy states in the first region under forward bias equals or slightly exceeds a separation energy between the upper and lower energy states in the second region under reverse bias by a delta separation energy such that under reverse bias in each stage of the second region the lower energy state is confined to the quantum well and the upper energy state is near the top of the quantum well in energy and localized in the quantum well to spatially overlap with the lower energy state such that the upper energy states moves into an avalanche multiplication region of the API) to detect echo photons at the first IR wavelength incident in the negative x direction in a receive mode.

2. The monolithic infrared transceiver of claim 1, wherein in each stage of the second region under reverse bias the upper energy state is either confined just below the top of the quantum well or lies just above the quantum well in the continuum states.

3. The monolithic infrared transceiver of claim 1, in which the heterostructure is a three-state system in which each stage includes the lower (E1), a middle (E2) and the upper (E3) states, wherein the forward biased first region intersubband lasing transition occurs from state E3→E2 while the E2→E1 transition is tuned to a phonon energy to depopulate state E2 so that E2 can accept an electron from the E3→E2 transition, wherein to detect the E3→E2 energy that was transmitted in an echo photon, under reverse bias of the second region the new energy positions of E1, E2 and E3 move such that absorption of the echo photon puts an electron in an uppermost state E3 near the top of the quantum well such that an echo photon is absorbed and promotes an electron to the upper energy state E3 where the electron is injected into the APD's reverse bias depletion field and is detected.

4. The monolithic infrared transceiver of claim 1, wherein each MQW stage comprises alternating quantum well and thin barrier layers in which the thickness of the quantum well layers varies such that each MQW state is asymmetric about a center position of the stage in the z direction.

5. The monolithic infrared transceiver of claim 1, wherein the monolithic intrinsic heterostructure includes an additional M MOW stages between the second p and n type doping layers in the z-direction in the second region to reduce a voltage drop across each of N+M MQW stages in the second region to provide the delta separation energy.

6. The monolithic infrared transceiver of claim 1, wherein the monolithic intrinsic heterostructure is configured with the first n type doping layer in the first region and the second n type doping layer in the second region on opposite sides of the heterostructure such that the APD has a reverse polarity with respect to the QCL to provide the delta separation energy.

7. The monolithic infrared transceiver of claim 1,
   wherein said first and second regions coexist end-to-end in a single waveguide in the x direction at the same position in a y direction,
   wherein in said receive mode,
   the forward bias applied to the first region is reduced such that the QCL is in a state of population inversion and gain but below the threshold for lasing to allow echo photons to pass through the first region, and
   the first minor is switchable to allow the echo photons to pass and enter the second region where the echo photon is detected by the reverse biased APD.

8. The monolithic infrared transceiver of claim 7, wherein said switchable first mirror comprises,
   top and bottom first metal mirror contacts between the first and second regions that sandwich a first mirror region of the heterostructure to form a m-i-m semiconductor;
   wherein in said transmit mode, said m-i-m semiconductor responsive to a bias to change a refractive index of the heterostructure to insert the first mirror to form the laser cavity, and
   wherein in said receive mode, said m-i-m semiconductor responsive to a bias to change a refractive index of the heterostructure to remove the first mirror and allow echo photons to enter the second region.

9. The monolithic infrared transceiver of claim 1, wherein said first and second regions exist in side-by-side first and second waveguides oriented in the x direction and separated in the y direction, wherein photons emitted in the positive x direction by the forward biased QCL return as echo photons in the negative x direction and are detected by the reverse biased APD.

10. The monolithic infrared transceiver of claim 9, further comprising:
top and bottom metal coupling contacts that sandwich a third region of the heterostructure to form a m-i-m semiconductor between the first and second regions; said m-i-m semiconductor responsive to a bias to modify a refractive index in the third region optically separate the first and second regions.

11. The monolithic infrared transceiver of claim 9, further comprising:
a third region of the heterostructure sandwiched between first and second mirrors in the z-direction and separated in the x-direction to form the laser cavity in the x direction and an n type doping layer above the laser cavity in which the heterostructure defines at least upper and lower energy states and a quantum well in each stage of a second quantum cascade laser (QCL), said third region exists side-by-side with the first region in a third waveguide separated in the y direction;
top and bottom coupling contacts that sandwich a fourth region of the heterostructure to form a m-i-m semiconductor between the first and third regions, said m-i-m semiconductor responsive to a bias to modify a refractive index in the fourth region to control lateral optical coupling between the first and third regions and the first and second QCLs.

12. The monolithic infrared transceiver of claim 11, wherein the heterostructure is comprised of a spintronic material, further comprising a source that applies a magnetic field in the z direction so that the optical coupling is controlled by both electrical and magnetic fields.

13. The monolithic infrared transceiver of claim 8, further comprising:
a third region of the heterostructure sandwiched between first and second mirrors in the z-direction and separated in the x-direction to form the laser cavity and an n type doping layer above the laser cavity in which the heterostructure defines at least upper and lower energy states and a quantum well in each stage of a second quantum cascade laser (QCL), said third region exists end-to-end with the first region within the single waveguide, said third region responsive to the application of a forward bias such that the upper and lower energy states in each MOW stage are confined in the quantum wells to induce intersubband lasing transitions in each of the MOW stages to emit photons at a second wavelength in a positive x direction in a transmit mode to pump the first QCL.

14. The monolithic infrared transceiver of claim 13, wherein the second QCL is tuned to emit at one-half the energy separation of the upper and lower states of the first QCL to encourage two photon absorption.

15. The monolithic infrared transceiver of claim 1, wherein said first and second regions are a common region of the heterostructure in the x direction at the same position in the y direction, wherein said n and p type layers sandwich the common region, wherein said common region is responsive to application of a bias that switches between forward bias to emit light at the first IR wavelength and the reverse bias to detect light at the first IR wavelength.

16. The monolithic infrared transceiver of claim 1, further comprising:
first and second top and bottom metal switching contacts (m) that form first and second m-i-m semiconductors in the heterostructure on opposite sides of the first region to provide the first and second mirrors that define the laser cavity, said m-i-m semiconductors responsive to the application of bias voltages to Q-switch the laser cavity and emit a pulse at the first IR wavelength.

17. The monolithic infrared transceiver of claim 1, further comprising:
first and second top and bottom metal contacts (m) that form first and second m-i-m semiconductors on opposite sides of the first region in the heterostructure to provide the first and second mirrors that define the laser cavity, at least one said metal contact including a plurality of fingers spaced in the x direction to define a grating, said grating fingers responsive to an applied bias to change the length of the laser cavity in the x direction and tune the first IR wavelength.

18. The monolithic infrared transceiver of claim 1, further comprising:
an optical low pass filter to remove echo photons whose energy is above the photon energy at the first IR wavelength; and
first and second top and bottom metal switching contacts (m) that form first and second m-i-m semiconductors on opposite sides of the second region in the heterostructure to provide the first and second mirrors that define the laser cavity, at least one said metal contact including a plurality of fingers spaced in the x direction to define a grating, said m-i-m semiconductors responsive to selective application of bias voltages to the grating fingers to modify the refractive index of the underlying heterostructure to form a high pass filter to remove echo photons below the first IR wavelength.

19. A monolithic infrared transceiver, comprising:
a monolithic intrinsic (i) semiconductor heterostructure including N Multiple Quantum Well (MQW) stages stacked in a z-direction on a substrate, each stage having upper and lower energy states and a quantum well;
first and second regions of the heterostructure having the same N MQW stage composition and variation in thickness in the z direction for all positions in x and y directions;
a quantum cascade laser comprising said first region sandwiched between top and bottom first and second metal gratings oriented in the z-direction and separated in the x-direction to define mirror regions and a first n type doping layer to inject electrons into a first MQW stage, said mirror regions responsive to application of a bias to selected fingers of the gratings to change the refractive index and form mirrors to Q-switch a laser cavity and to tune the laser cavity a specified first IR wavelength, said first region responsive to application of a forward bias such that the upper and lower energy states in each MQW stage are confined in the quantum wells to induce intersubband lasing transitions in each of the MQW stages that contribute to a photon gain of the cavity to emit photons at the first IR wavelength in a positive x direction in a transmit mode; and
an avalanche photodiode (APD) comprising said second region of the heterostructure sandwiched between second p and n type doping layers in the z-direction that form a p-i-n semiconductor and between top and bottom third and fourth metal gratings oriented in the z-direction and separated in the x-direction to define minor regions, said mirror regions responsive to application of a bias to change the refractive index to tune a cavity to the first IR wavelength, wherein said monolithic intrinsic heterostructure is configured such that a separation energy between the upper and lower energy states in the first region under forward bias equals or slightly exceeds a separation energy between the upper and lower energy states in the second region under reverse bias by a delta separation energy such that under reverse bias in each stage of the second region the lower energy state is confined to the quantum well and the upper energy state is near the top of the quantum well in energy and localized in the quantum well to spatially overlap with the lower energy state such that the upper energy states moves into an avalanche multiplication region of the APD to detect echo photons at the first IR wavelength incident in the negative x direction in a receive mode.

20. A monolithic infrared transceiver, comprising:
a monolithic intrinsic (i) semiconductor heterostructure including N Multiple Quantum Well (MQW) stages in a z direction, each stage having upper and lower energy states and a quantum well;
a first region of the heterostructure in which under forward bias the upper and lower energy states are confined in the quantum well to form a quantum cascade laser (QCL) that emits photons in a positive x direction; and
a second region of the heterostructure, wherein said monolithic intrinsic heterostructure is configured such that a separation energy between the upper and lower energy states in the first region under forward bias equals or slightly exceeds a separation energy between the upper and lower energy states in the second region under reverse bias by a delta separation energy such that under reverse bias in each stage of the second region the lower energy state is confined in the quantum well and the upper energy state is near the top of the quantum well in energy and localized in the quantum well to spatially overlap the lower energy state such that the upper energy state moves into an avalanche multiplication region of an avalanche photodiode (APD) to detect echo photons incident in the negative x direction, wherein said first and second regions have the same N MQW stage composition and variation in thickness in the z direction.

21. The monolithic infrared transceiver of claim 20, wherein the heterostructure comprises one or more of the following: each said MQW stage comprises alternating quantum well and thin barrier layers in which the thickness of the quantum well layers varies such that each MQW state is asymmetric about a center position of the stage in the z direction; an additional M MQW stages in the z-direction in the second region to reduce a voltage drop across each of N+M MQW stages in the second region under reverse bias; and the APD having a reverse polarity with respect to the QCL.

22. The monolithic infrared transceiver of claim 21, wherein in each stage of the second region under reverse bias the upper energy state is either confined just below the top of the quantum well or lies just above the quantum well in the continuum states.

* * * * *

UNITED STATES PATENT AND TRADEMARK OFFICE
CERTIFICATE OF CORRECTION

PATENT NO. : 11,456,577 B2
APPLICATION NO. : 16/941254
DATED : September 27, 2022
INVENTOR(S) : Stoltz et al.

Page 1 of 2

It is certified that error appears in the above-identified patent and that said Letters Patent is hereby corrected as shown below:

In the Drawings

Sheet 5 of 8, Fig. 5, reference numeral 300, Line 3, delete "HETERJUNCTION" and insert --HETEROJUNCTION-- therefor In the Specification In Column 1, Line 10, delete "(APDS)," and insert --(APDs),-- therefor In Column 2, Line 49, delete "SPADs" and insert --SAPDs-- therefor In Column 6, Line 46, delete "116" and insert --122-- therefor In Column 6, Line 49, delete "116" and insert --122-- therefor In Column 11, Line 34, delete "412." and insert --416.-- therefor In Column 11, Line 47, delete "424" and insert --418-- therefor In the Claims In Column 13, Line 65, in Claim 1, delete "API)" and insert --APD-- therefor In Column 14, Line 29, in Claim 5, delete "MOW" and insert --MQW-- therefor In Column 14, Line 49, in Claim 7, delete "minor" and insert --mirror-- therefor In Column 15, Line 51, in Claim 13, delete "MOW" and insert --MQW-- therefor In Column 15, Line 53, in Claim 13, delete "MOW" and insert --MQW-- therefor Signed and Sealed this
First Day of August, 2023

Katherine Kelly Vidal
*Director of the United States Patent and Trademark Office*

CERTIFICATE OF CORRECTION (continued)
U.S. Pat. No. 11,456,577 B2

In Column 15, Line 54, in Claim 13, before "wavelength", insert --IR--

In Column 16, Line 67, in Claim 19, delete "minor" and insert --mirror-- therefor In Column 18, Line 17, in Claim 21, after "following:", insert a linebreak In Column 18, Line 21, in Claim 21, after "direction;", insert a linebreak In Column 18, Line 24, in Claim 21, after "and", insert a linebreak